US007012466B2

(12) United States Patent
Cerisola

(10) Patent No.: US 7,012,466 B2
(45) Date of Patent: Mar. 14, 2006

(54) VOLTAGE-TO-CURRENT CONVERTER

(76) Inventor: Mauro Cerisola, Agilent Technologies Italia, Via G. Reiss Romoli, 274, 10148, Italy (IT)

( * ) Notice: Subject to any disclaimer, the term of this patent is extended or adjusted under 35 U.S.C. 154(b) by 68 days.

(21) Appl. No.: 10/771,546

(22) Filed: Feb. 5, 2004

(65) Prior Publication Data

US 2004/0160277 A1 Aug. 19, 2004

(30) Foreign Application Priority Data

Feb. 5, 2003 (EP) .................................. 03250744

(51) Int. Cl.
*H03F 3/45* (2006.01)

(52) U.S. Cl. ...................... 330/260; 330/102; 330/103; 330/104

(58) Field of Classification Search .................. 330/69, 330/85, 102–105, 260; 372/38.02
See application file for complete search history.

(56) References Cited

U.S. PATENT DOCUMENTS 3,564,444 A 2/1971 Walsh
3,638,133 A * 1/1972 Meyers ........................ 330/104
4,484,331 A * 11/1984 Miller .......................... 372/34
5,237,558 A * 8/1993 Horikiri et al. .......... 369/53.26
5,856,758 A * 1/1999 Joffe et al. ..................... 330/85
5,881,081 A * 3/1999 Hwang .................... 372/38.04
5,986,910 A 11/1999 Nakatsuka

OTHER PUBLICATIONS

Patent Abstracts of Japan vol. 009, No. 140 (E-321), Jun. 14, 1985 (abstract of JP 60 021585A).

* cited by examiner

*Primary Examiner*—Peguy Jeanpierre
*Assistant Examiner*—Khai Nguyen

(57) ABSTRACT

A load responds to a voltage-to-current converter including a differential amplifier. A sensing resistor is series connected with the load and first and second feedback resistors, respectively included in first and second voltage dividers having taps connected to non-inverting and inverting inputs of the amplifier. One divider is connected between a first terminal of the sensor resistor and one voltage responsive input terminal of the converter. Another divider is connected between the second terminal of the sensor resistor and a second converter input terminal, that can be grounded or voltage responsive. The feedback resistors have the same value that is much greater than the sensor resistor value. The first divider can be connected to the first or second terminal of the sensor resistor and vice versa for the second divider.

34 Claims, 4 Drawing Sheets

VOLTAGE-TO-CURRENT CONVERTER

FIELD OF INVENTION

The present invention relates to voltage-to-current converters.

BACKGROUND ART

Microcontroller-supervised systems use digital-to-analog converters (DACs) in order to generate analog voltages used for controlling other devices. While commercial DACs generate a voltage as the analog output, in some cases the device to be controlled is essentially current-driven, which means that the behaviour of the controlled device depends on the current injected into or sunk through its input. In the case of these current-driven circuits, additional circuitry is required between the DAC and the controlled device. Such additional circuitry is usually in the form of a voltage-to-current converter, which is also currently referred to as a "transconductance" amplifier.

The simplest approach to voltage-to-current conversion is shown in FIG. 1 and essentially provides for the use of a single, purely passive component such as a resistor. In the diagram of FIG. 1, a resistor R is connected between the output of the DAC and a current-controlled device D, such as a driver unit for a load, such as a semiconductor diode laser source L. The DAC is controlled via a line C by a microcontroller designated M. (While the present invention was developed by paying specific attention to the possible use of circuitry for controlling a laser driver via a microcontroller, reference to this use is not to be construed as limiting the scope of the invention.)

If $V_{dac}$ designates the voltage output of the DAC and $V_{in}$ is the voltage at the input of the controlled device D the current $I_{in}$ input to the device D can be simply expressed as:

$$I_{in}=(V_{dac}-V_{in})/R.$$

The arrangement of FIG. 1 has the disadvantage that the resulting current $I_{in}$ is not stable when the load voltage e.g., the voltage at the input of device D, changes. Additionally, there may be an offset in voltage-to-current response that is a zero current for non-zero voltage and/or vice versa.

Also, there is no positive $I_{in}$ for positive $V_{dac}$ if $V_{dac}$ is less than $V_{in}$. If $V_{in}$ changes (for instance in the presence of a thermal drift in the device to be controlled), $I_{in}$ changes even if the DAC setting (and thus $V_{dac}$) has not changed, which is undesirable in most applications.

An alternative prior art arrangement is shown in FIG. 2, where the same references designate elements identical or equivalent to those already considered in FIG. 1.

The arrangement of FIG. 2 employs a DC operational amplifier A having (1) a positive (non-inverting) input terminal fed with the output voltage $V_{dac}$ from the DAC and (2) an inverting input terminal fed with the voltage provided by a negative feedback loop comprising a voltage divider connected between the output of the amplifier A and ground. Amplifier A is constructed so the voltage and current at its output terminal is directly proportional to and has the same polarity as the voltage at the amplifier non-inverting input terminal minus the voltage at the amplifier inverting input terminal. The voltage divider in question includes device D to be controlled and resistor R.

In this case, if device D comprising the load of the circuit has an impedance $Z_L$ the current $I_{load}$ flowing through the load can be expressed as:

$$I_{load}=V_{dac}/R.$$

In this case the load current $I_{load}$ is linear with $V_{dac}$. However, the load D floats, that is neither of its terminals is connected to ground. This is seldom true for loads that are active devices such as, for instance, inputs of integrated circuits.

A classic circuit for a ground-terminated load is shown in FIG. 3 wherein voltage $V_{dac}$ is applied to the inverting input terminal of the amplifier A via first resistor B1. Resistor B4 is connected as a feedback resistor between the amplifier output terminal and the inverting input terminal. The resistors B1 and B4 thus comprise a first voltage divider between the amplifier output and the DAC output. An intermediate point of the divider is connected to the inverting input of the amplifier A. A second voltage divider including resistors B2 and B3 is somewhat similarly associated with the non-inverting input terminal of the amplifier A. Specifically, the resistor B3 is connected between the amplifier output terminal and the non-inverting input terminal while the resistor B2 is connected between the non-inverting input terminal of the amplifier A and ground. Load D is connected in parallel with resistor B2.

The main disadvantage of the circuit of FIG. 3 is that the overall gain is negative. When $V_{dac}$ is positive, $I_{load}$ is negative which means that to have a positive $I_{load}$, $V_{dac}$ must be negative. The requirement for $I_{load}$ and $V_{dac}$ to have opposite polarities requires a bi-polarity DC power supply. Because most circuits use single, positive-only or negative-only power supply voltages, the circuit of FIG. 3 is usually not feasible.

SUMMARY OF THE INVENTION

One aspect of the invention relates to a voltage-to-current converter including (1) a differential amplifier having non-inverting and inverting inputs, and (2) associated circuitry for (a) applying an input voltage signal to the converter and (b) deriving from the associated circuitry an output signal current for driving a load. A sensing resistor is series connected with the load and has opposite first and second terminals for respectively applying voltages to first and second feedback loops. The loops are respectively associated with the non-inverting and inverting inputs of the differential amplifier. Each feedback loop includes (a) an intermediate tap connected to a respective input of the differential amplifier, (b) a first branch including a first resistor connected between the intermediate point associated with the particular feedback loop and the terminal of the sensing resistor associated with the particular feedback loop. Hence, the sensing resistor is connected between the first branches of the first and second feedback loops. Each of the loops also includes a second branch having a second resistor connected between the intermediate point associated with the particular feedback loop and an input port of the converter circuit. The first resistors in the feedback loops have resistance values that are of the same order of magnitude and are substantially higher than the resistance values of the sensing resistor and the load. The current across the sensing resistor constitutes an output signal current directly proportional to the input voltage signal applied between the input ports of the second branches of the first and the second feedback loops.

Further aspects of the present invention are directed to several different features in combination with circuitry having a common theme. The circuitry having the common theme comprises an output terminal connected to a load, e.g., laser diode. An amplifier arrangement has inverting and non-inverting input terminals and an output terminal for deriving an output voltage having a magnitude directly proportional to the difference in the voltages at the inverting and non-inverting output terminals. A sensing resistor is connected between the circuit output terminal and the amplifier arrangement output terminal. A first feedback path is connected between the output terminal of the amplifier arrangement and one of the input terminals of the amplifier arrangement. A second feedback path is connected between the output terminal of the circuit and the other input terminal of the amplifier arrangement. The first feedback circuit is included in a first resistive voltage divider connected between the circuit input terminal and the output terminal of the amplifier arrangement. The second feedback circuit is included in a second resistive voltage divider connected between a further terminal and the circuit output terminal. The first voltage divider has a tap connected to drive the first input terminal of the amplifier arrangement. The second voltage divider has a tap connected to drive the second input terminal of the amplifier arrangement. The voltage dividers have voltage division factors and the sensing resistor has a value for causing the current flowing through the circuit output terminal into the load to be directly proportional to the difference in the voltages at the circuit input terminal and the further terminal.

This common theme, except for the laser diode, is disclosed by Walsh (U.S. Pat. No. 3,564,444). However, the Walsh patent does not disclose several additional features that have advantages over the Walsh circuit for converting an input voltage into a current that is applied to a load, particularly a laser diode load.

The first feature is that the resistance of the first voltage divider between the output and first input terminals of the amplifier arrangement and the resistance of the second voltage divider between the circuit output terminal and the second input terminal of the amplifier arrangement are of the same order of magnitude and have much greater resistance than the resistance of the sensor resistance. By providing such resistances in the first and second voltage dividers, as stated, (1) more efficient operation is attained because of the lower current supplied to the inverting and non-inverting input terminals of the amplifier arrangement and (2) substantially balanced operation of the amplifier arrangement occurs.

A second feature is that (1) the resistance ($R_1$) of the first voltage divider between the output and first input terminals of the amplifier arrangement is of the same order of magnitude as the resistance of the second voltage divider between the circuit output terminal and the second terminal of the amplifier arrangement, and (2) the resistance ($R_2$) of the first voltage divider between the first input terminal of the amplifier arrangement and the circuit input terminal is of the same order of magnitude as the resistance between the second input terminal of the amplifier arrangement and the further terminal. Because the values of $R_1$, as well as $R_2$ are as set forth in this feature there is greater symmetry, and therefore more stable operation, to the amplifier arrangement. This is in contrast to the Walsh circuit wherein there is a 100:1 ratio between the equivalent resistances of the first and second voltage dividers.

The third feature involves connecting first and second electrodes of a laser diode load to be respectively responsive to the voltage of a non-grounded voltage of a DC voltage source and the circuit output terminal. The DC voltage source and the laser diode polarity are such that DC current flows between the DC voltage source ungrounded terminal and the circuit output terminal via the laser diode. In contrast, in the Walsh circuit, a diode is connected between the circuit output terminal and ground. By connecting the laser diode in accordance with this feature, applicant attains greater laser diode operating stability (for certain types of lasers) than is attained by connecting the diode terminals between the circuit output terminal and ground.

According to a fourth feature, the first and second input terminals of the amplifier arrangement are respectively the non-inverting and inverting input terminals of the amplifier arrangement. In addition, the amplifier arrangement is arranged in a differential way so the gain factor polarity between inverting and non-inverting input terminals and the output terminal of the amplifier arrangement causes the current at the output of the amplifier arrangement to be directly proportional to and the same polarity as (Va–Vb), where Va and Vb are respectively the voltages at the non-inverting and inverting input terminals of the amplifier arrangement. Such an amplifier arrangement preferably includes a conventional operational amplifier. In the Walsh circuit, there is only one input terminal (Vin). By employing an amplifier arrangement including the differential feature as stated, the circuit can (1) handle certain output current ranges that Walsh cannot handle, and (2) perform certain functions that Walsh cannot perform.

A fifth feature involves connecting the circuit input terminal and the further terminal to first and second input voltage sources, respectively. As a result, the circuit is adapted to supply to the circuit output terminal a current having a magnitude directly proportional to the difference of the voltages of the first and second voltage sources as applied to the circuit input and further terminals. In Walsh, the equivalent of the further terminal is grounded and connected to a first voltage divider consisting of two series connected resistors each having a value of 1 kilohm. The first voltage divider has a tap connected between the two 1 kilohm resistors connected to the inverting input terminal of operational amplifier. The non-inverting input terminal is connected to a second voltage divider consisting of two 100 kilohm resistors and driver by an input source. The different impedance levels of the two voltage dividers precludes effective operation of the Walsh circuit as a differential amplifier responsive to a pair of input voltage sources.

BRIEF DESCRIPTION OF THE DRAWING

The invention will now be described, by way of non-limiting example only, with reference to the annexed figures of drawing, wherein.

DETAILED DESCRIPTION OF THE DRAWING

Figure 1:
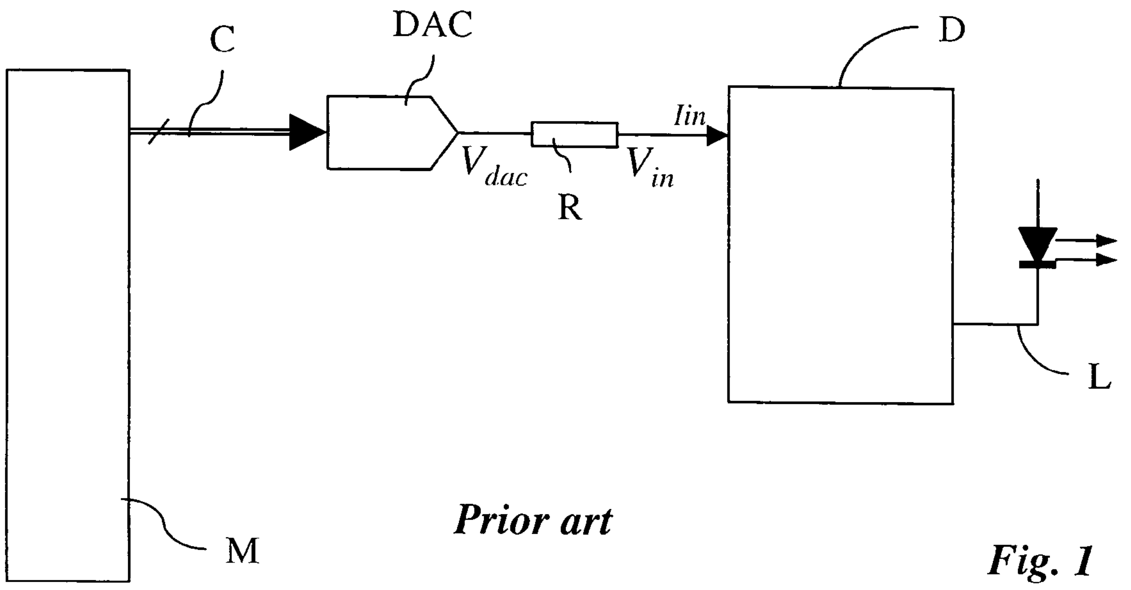
FIGS. 1 to 3, as previously described, relate to the prior art.
Figure 2:
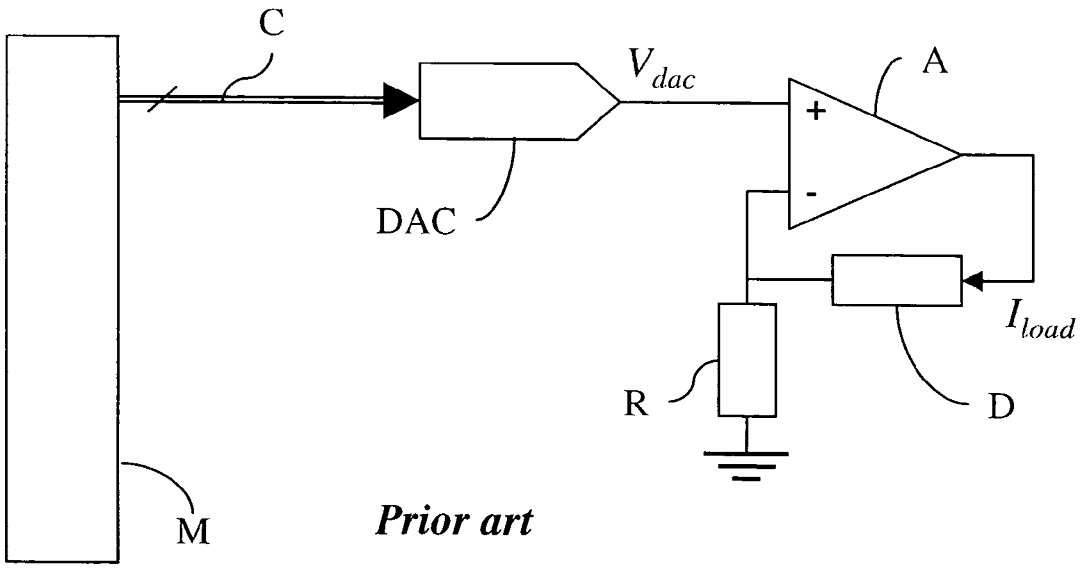
Figure 3:
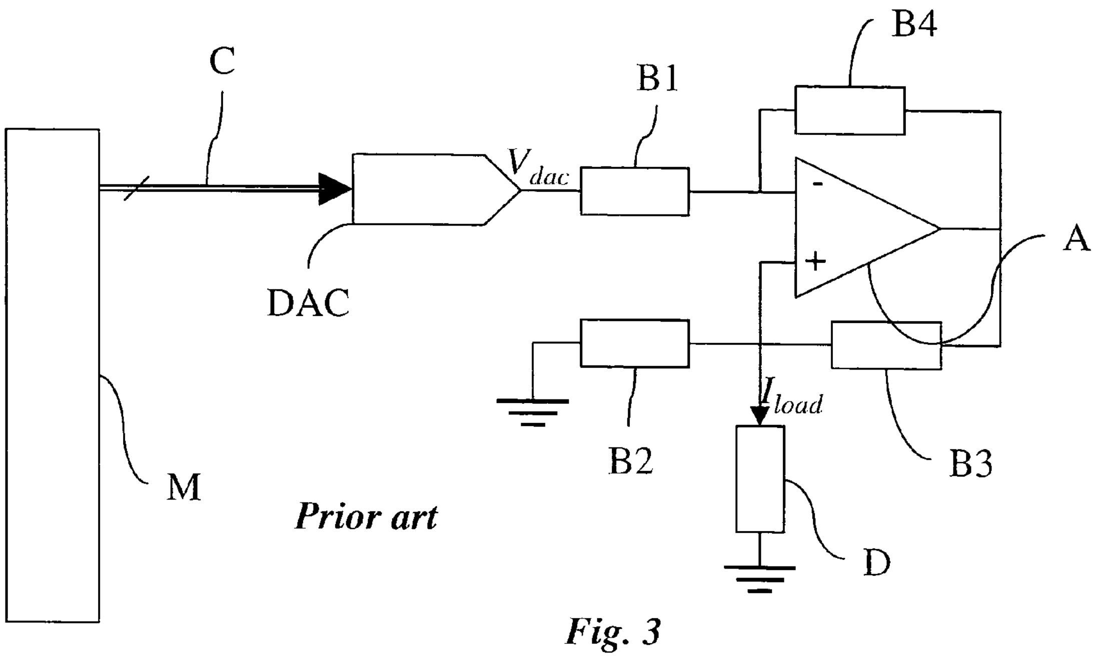

Throughout FIGS. 4 to 7 the same references already appearing in FIGS. 1 to 3 designate parts or elements (e.g. a microcontroller, a digital to analog converter, and so on) that were discussed in the foregoing.

Figure 4:
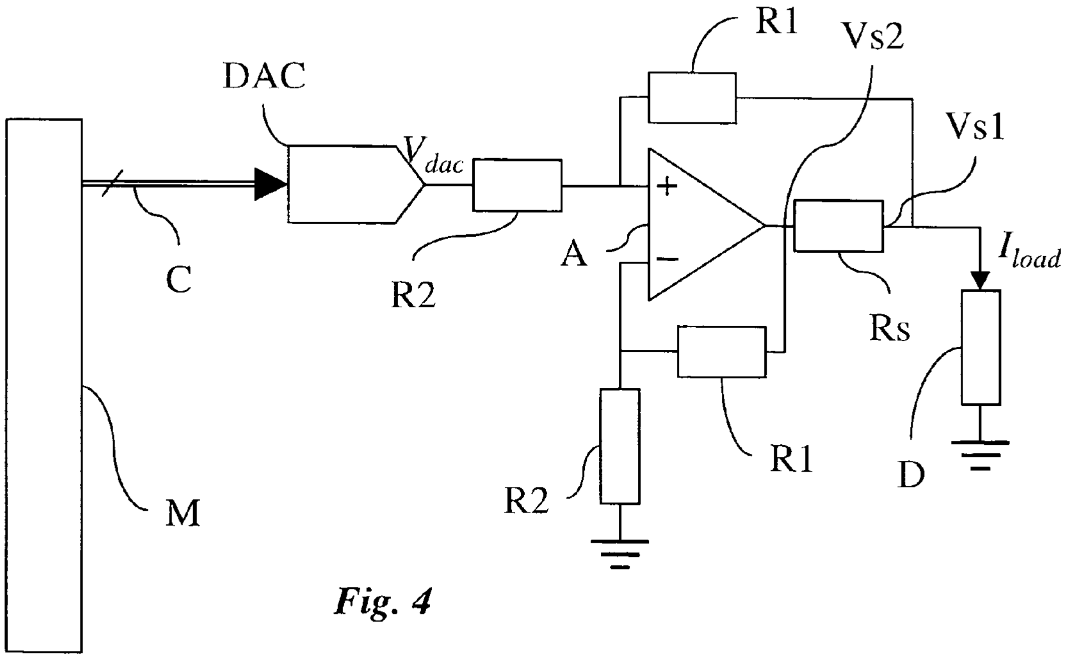
FIG. 4 is a circuit diagram of a first circuit according to the first embodiment of the invention.

Similarly to the arrangement of FIG. 3, the arrangement of FIG. 4 provides for the presence of positive and negative feedback loops including voltage dividers, including four resistors, associated with both inputs of the amplifier A.

The arrangement of FIG. 4 includes a further resistor Rs associated with the output of the amplifier A. In this specific arrangement, that represents one of the many possible embodiments of the invention, the resistor Rs has a first lead or terminal connected to the output of the amplifier A and a second terminal connected to a first terminal of the load D. The opposite terminal of the load D, that has an impedance $Z_L$, is connected to ground. The resistor Rs is thus arranged in series with the load D. The current flowing through the load D is designated $I_{load}$.

A first one of voltage dividers associated with the inputs of the amplifier A comprises a negative feedback loop including:

(1) a first (upper) branch with a resistor R1 connected between the inverting input of the amplifier A and the terminal of Rs directly connected to the output of the amplifier A to sense a voltage Vs2, and (2) a second (lower) branch with a resistor R2 connected between the inverting input of the amplifier A and ground.

The second voltage divider associated with the inputs of the amplifier A comprises a positive feedback loop including:

(1) a first branch with a resistor R1 connected between the non-inverting input of the amplifier and the terminal of the resistor Rs that is common with an ungrounded terminal of load D to sense a voltage Vs1, and (2) a second branch with a resistor R2 through which the output of voltage from the DAC converter, namely $V_{dac}$, is applied to the non-inverting input of the amplifier A.

The values of the resistors R1 are selected in such a way that the currents flowing through them are negligible so that the current flowing through the sensing resistor Rs is identical to the current $I_{load}$ flowing through the load D. Due to the action performed by the two feedback loops comprising the voltage dividers including resistors R1 and R2, the current through Rs is proportional to the input voltage $V_{dac}$.

More specifically, solving the network equations ruling the behaviour of the circuit arrangement of FIG. 4 (which equations and the respective solving procedure are not reported herein) shows that, provided R1 is much larger than Rs, $Z_L$, (where $Z_L$ denotes the impedance value of the load D) the current flowing through the load D, namely $I_{load}$, can be expressed as:

$$I_{load}=(V_{dac}/Rs).(R1/R2)$$

Since the resistors R1 are connected to the two opposite terminals of Rs, other components (as better explained in the following) can be connected in series with the output of the operational amplifier A, that is between the output of the operational amplifier A and Rs/R1, but this does not change the behaviour and operation of the circuit shown.

The feedback resistors R1 (and indirectly R2, since the ratio R1/R2 sets the gain of the transimpedance amplifier) have a value much higher than the resistance/impedance values of the "sensing" resistor Rs and the load $Z_L$. As a result the resistors R1, R2 comprising the feedback loops/voltage dividers primarily sense voltages while the currents flowing through resistors $R_1$ and $R_2$ are negligible. Those of skill in the art will appreciate that while an impedance value $Z_L$, including both resistive (real) and reactive (imaginary) components, is being referred to for the sake of precision, in most practical applications the load D is essentially resistive. In any case, a resistance value being much higher than an impedance value simply means that the resistance value is much higher (at least an order of magnitude) than the modulus of the impedance.

Provided these conditions are met, in the arrangement of FIG. 4 the load current is proportional to (1) the controlling voltage $V_{dac}$, (2) the ratio of the values of the feedback resistors R1, R2 and inversely proportional to the value of the sensing resistor Rs, i.e., $$I \text{ load} = \frac{V_{dac}}{Rs}\left(\frac{R_1}{R_2}\right).$$

Also the output current is independent of the load impedance $Z_L$, to thereby provide a true transconductance amplifier. The gain (transconductance) of the converter can thus be set to a desired value by properly choosing R1, R2, Rs. Because the transconductance depends on R1/R2 and Rs, if any constraint exists on one of these factors (for instance Rs), the other factor can be easily adapted in order to obtain the desired gain.

The arrangement shown in FIG. 4 has no offset (apart from the operational amplifier input offset) and requires only a single supply voltage. The operational amplifier A must operate with a power supply having only two output terminals, one at ground and the other at a supply voltage. This is a requirement that is currently met by most currently available low cost "rail-to-rail" input operational amplifiers.

Identical values of R1 and identical values of R2 (where R1 is not typically equal to R2) in the two feedback loops associated with the amplifier represent a preferred choice that provides stable operation of the converter circuit and enable gain to be dependent on the ratio $$\left(\frac{R_1}{R_2}\right),$$

rather than only on the value of Rs. As a result, the value of Rs need not be used to control the range of $V_{dac}$ and drift of the amplifier. An important associated requirement for proper operation of the converter of FIG. 4 is that the voltage divider ratios of the positive feedback loop and the negative feedback loop are the same.

Figure 5:
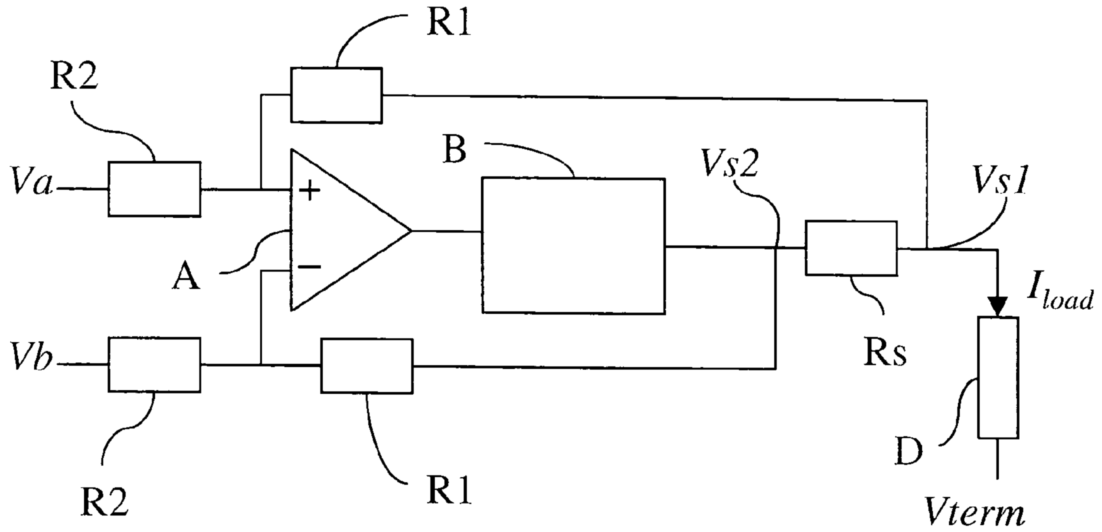
FIG. 5 is modification and generalization of the circuit of FIG. 4.

The block diagram of FIG. 5 is a generalization of FIG. 4 by regarding the input voltage $V_{dac}$, as a differential input voltage ($V_a-V_b$) applied to the inverting and non-inverting inputs of the amplifier A via the two resistors R2 in the first and second dividers.

Also, the values Vs1 and Vs2 whose difference, (Vs2−Vs1), is the voltage across sensing resistor Rs can be obtained as a differential value that can be derived from any point of the circuit, since resistor Rs is connected in series with the load D.

Because, the values of the resistors R1 are selected so that the currents flowing through them are negligible, the current flowing through the sensing resistor Rs is identical to the current $I_{load}$ flowing through the load D. Due to the action performed by the two feedback loops included in the voltage dividers including resistors R1 and R2, such a current is proportional to input voltage $V_{dac}$ (in the circuit of FIG. 4) or the difference ($V_a-V_b$) (in the circuit of FIG. 5).

The current $I_{load}$ through the load connected to resistor Rs causes a proportional differential voltage Vs2−Vs1 across sensing resistor Rs. This is also irrespective of any thermal drift or offset voltage Vterm at the load terminal opposite the load terminal directly connected to Rs. It is to be understood, however, that the offset voltage Vterm can be ground or a finite, non-zero value.

The block B shown in FIG. 5 has an input terminal connected directly to the output terminal of amplifier A and an output terminal directly connected to the terminal of resistor Rs that drives the voltage divider having its tap connected to the non-inverting input terminal of amplifier A. Block B, is e.g. an amplifier stage in the form of a current amplifier or in the form of a voltage amplifier. In the embodiment of FIG. 4 block B is merely a wire between the output of amplifier A and a terminal of resistor Rs. In the generalization of FIG. 5 block B has a gain factor with a positive value, so that block B can provide AC or DC signal coupling between its input and output terminals.

A requirement for the arrangement shown in FIG. 5, which facilitates closed-loop control, is that when the voltage at the operational amplifier A output increases the differential value Vs2−Vs1 must also increase, to prevent the circuit from oscillating. To provide stability, the polarity of the combined gain of the amplifier arrangement comprising amplifier A cascaded with block B must be positive for the circuit of FIG. 5. If the gain polarity of block B is negative, the inputs of operational amplifier A are reversed to also change the polarity of the operational amplifier gain. In particular if block B has a negative gain factor, the voltage at the terminal where Vs2 is derived in FIG. 5 is fed back through a first of resistors R1 to the non-inverting input terminal of amplifier A and the voltage at the terminal where Vs1 is derived in FIG. 5 is fed back to the inverting input terminal of amplifier A through a second of resistors R1. The inverting and non-inverting input terminals of such an amplifier arrangement, with a negative gain block B, are respectively responsive to Va and Vb, as coupled through a pair of resistors R2. The load current of such a modified amplifier arrangement is $$I_{load} = \frac{(V_a - V_b)}{Rs} \cdot \frac{R_1}{R_2},$$

i.e., the same as in the device of FIG. 5 that has a positive gain factor in block B. More generally, the operational amplifier stability requirements obtained from a data-sheet of the operational amplifier A must be met.

Figure 6:
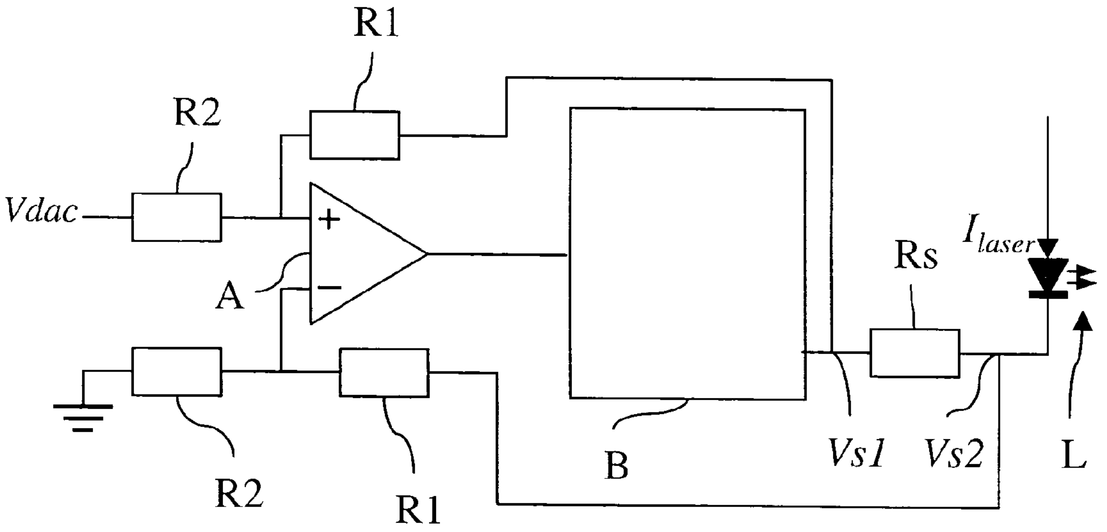
FIGS. 6 and 7 are circuit diagrams of further embodiments of the invention, particularly applicable for controlling a laser diode.

FIG. 6 is a block diagram of an exemplary application of the generalized circuit of FIG. 5 to precisely set the current of a laser diode L driven by a laser current driver comprising the block B that has a negative gain factor so that the voltage at the output of block B is directly proportional to and the same polarity as ($V_B$−$V_A$), where $V_A$ and $V_B$ are respectively the voltages at the non-inverting and inverting input terminals of the "voltage-to-current converter" as in FIG. 5.

To provide the negative gain factor and employ a single ended DC power supply, block B must have (1) AC signal coupling (without DC signal coupling) and the output of $V_{dac}$ as applied to the circuit of FIG. 6 must include AC components that block B passes and supplies to the load via resistor Rs, or (2) DC coupling with suitable DC offset.

In FIG. 6, the voltage dividers are connected to terminals of resistor Rs that are reversed from the terminals of FIG. 5. In FIG. 6, a first resistor R1 is connected between the non-inverting input terminal of amplifier A and the common terminal of the output of block B and resistor Rs, where Vs1 is derived. In FIG. 5, such a first resistor R1 is connected between the non-inverting input terminal of amplifier A and the common terminal of resistor Rs and load D, where voltage Vs1 is derived. In FIG. 6, a second resistor R1 is connected between the inverting input terminal of amplifier A and the common terminal of resistor Rs and load L where voltage Vs2 is derived. In FIG. 5 the second resistor R1 is connected between the inverting input terminal of amplifier A and the common terminal of the output of block B and resistor Rs where voltage Vs2 is derived.

In the arrangement of FIG. 6, the laser L represents the load proper and the current through the laser L is sunk by the driver B, which acts as a current-controlled current generator. To enable block B to sink the current through laser diode L the anode of laser diode L is connected to an ungrounded positive voltage terminal of a DC bias source and the cathode of the laser source is connected to the terminal of resistor Rs where voltage Vs2 is derived. A DC bias current thereby flows from the bias source through the laser diode, thence through resistor Rs and a high output impedance of block B, between the block output terminal and ground. The output of block B changes, i.e., modulates, the DC bias current in response to the voltage $V_{dac}$. Such biasing and control provides better operation of the light emitting properties of some laser diodes than is attained by connecting such laser diodes between ground and the terminal where Vs1 is derived in FIG. 5.

Block B in FIG. 5 can source the current through laser diode L by reversing the diode polarity from the polarity illustrated in FIG. 6 so the anode of the diode is connected to the terminal where voltage Vs1 is derived and the cathode of the diode is grounded.

The following relationship applies to the circuit of FIG. 6:

$$(Vs2-Vs1)=(R1/R2).V_{dac}$$

and the current $I_{laser}$ through the laser L can be expressed as:

$$I_{laser}=(Vs2-Vs1)/Rs=(R1/R2)\ (V_{dac}/Rs),$$

provided R1, R2 are much larger than Rs.

Figure 7:
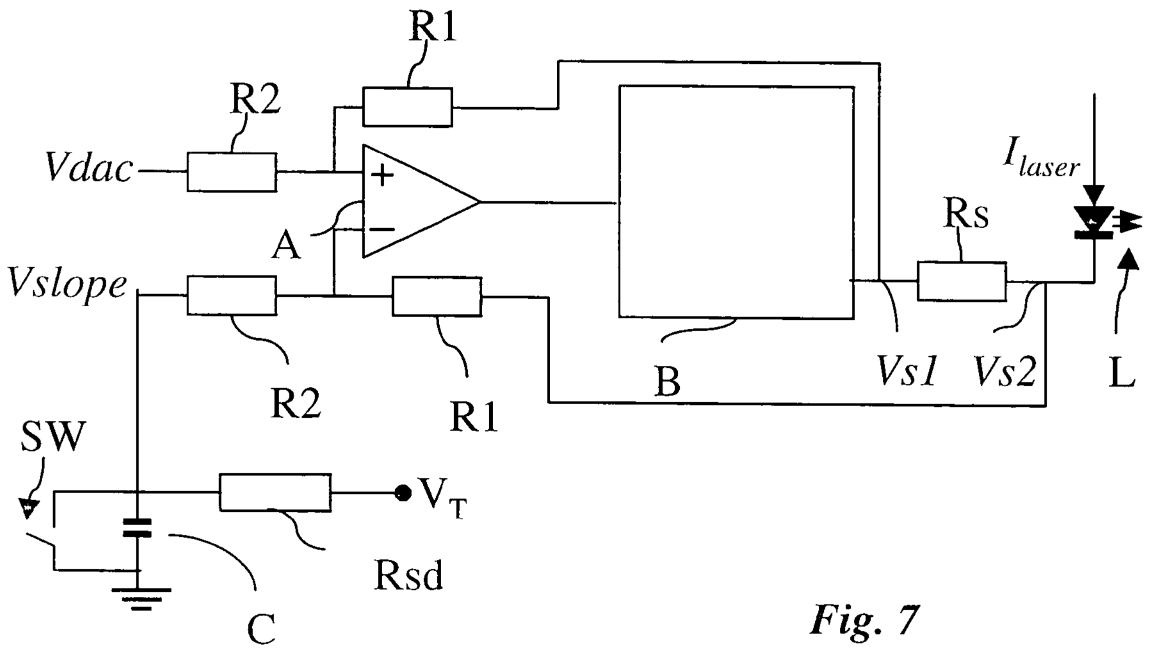

FIG. 7 is a circuit diagram of a modification of the circuit of FIG. 6. The circuit of FIG. 7 is concerned with certain applications wherein the current $I_{laser}$ flowing through the laser L must be shut down slowly, that is provided by slowly decreasing the voltage applied across the diode to avoid sudden changes in the power balance of optical amplifiers responsive to the optical output of the laser diode.

Optical systems usually require the laser source to be shut down within a time interval that is shorter than the intervals which can be achieved by gradually decreasing the DAC output voltage. This is because of the minimum timing requirements of the digital communication between the microcontroller and the DAC. Conversely, fully satisfactory operation of the laser can be achieved by using the arrangement shown in FIG. 7 that essentially corresponds to a combination of the arrangements shown in FIGS. 5 and 6 because the terminal of resistor R2 that is grounded in FIG. 6 is connected to respond to voltage $V_{slope}$.

The voltage $V_{slope}$ is kept at zero level (that is at ground level) during normal operation of laser L. When gradual turn off of the laser is to be achieved, $V_{slope}$ gradually increases. The circuit of FIG. 7 subtracts the gradually increasing voltage $V_{slope}$ from $V_{dac}$, effectively reducing the laser current in a controlled way, as described in connection with FIG. 5.

The rising slope voltage $V_{slope}$ can be generated in a known manner, for instance by a programmed control voltage source or a simple RC network including:

(1) a capacitor Cs connected between ground and a first terminal of resistor R2, and (2) a resistor Rsd connected between the first terminal of resistor R2 and a bias voltage source $V_T$.

A switch, such as an electronic switch SW, is connected in parallel to capacitor Cs to keep the capacitor grounded (uncharged) during normal operation of the circuit so that $V_{slope}$ is kept at zero level during normal operation of laser L.

When gradual turn off is required, the switch SW is opened, thus permitting the capacitor Cs to be gradually charged towards $V_T$ through the resistor Rsd. The voltage $V_{slope}$ thus gradually increases and subtracts from $V_{dac}$, effectively reducing the laser current in a controlled way.

Of course, without prejudice to the underlying principle of the invention, the details and embodiments may vary, also significantly, with respect to what has been described and shown, by way of example only without departing from the scope of the invention as defined by the annexed claims.

What is claimed is:

1. A voltage-to-current converter including (1) a differential amplifier having non-inverting and inverting input terminals, and (2) associated circuitry for (a) applying an input voltage signal to the converter, and (b) deriving from the associated circuitry an output signal current for driving a load; a sensing resistor series connected with the load and having opposite first and second terminals for respectively applying voltages to first and second feedback loops, the loops being respectively associated with the non-inverting and inverting input terminals of the differential amplifier, each of the loops including (a) an intermediate tap connected to a respective input of the differential amplifier, and (b) a first branch including a first resistor connected between the intermediate tap associated with the particular feedback loop and the terminal of the sensing resistor associated with the particular feedback loop, whereby the sensing resistor is connected between the first branches of the first and second feedback loops, each of the loops also including a second branch having a second resistor connected between the intermediate tap associated with the particular feedback loop and an input port of the converter circuit, the first resistors in the feedback loops have resistance values that are of the same order of magnitude and are substantially higher than the resistance values of the sensing resistor and the load, whereby the current adapted to flow across the sensing resistor is an output current signal directly proportional to the input voltage signal applied between input ports of the second branches of the first and the second feedback loops, said first and second feedback loops include voltage dividers having respective voltage divider ratios defined by said first resistor in said first branch and said second resistor in said second branch, and wherein said respective voltage dividers are the same for said first and second feedback loops.

2. The converter of claim 1, wherein said input voltage signal is adapted to be applied to the input port of the second branch of said first feedback loop, and the input port of said second branch of said second feedback loop is connected to the ground.

3. The converter of claim 1, wherein the input ports of the second branches of said first and second voltage feedback loops are input ports for said conversion circuit having said input voltages signal applied therebetween in a differential arrangement.

4. The converter of claim 1, wherein the first resistors in said first branches of said first and second feedback loops have identical resistance values.

5. The converter of claim 1, wherein said first branch in said first feedback loop is connected to the output of said differential amplifier.

6. The converter of claim 1, wherein said intermediate tap in said first feedback loop is connected to the inverting input of said differential amplifier.

7. The converter of claim 1, wherein said first branch of said second feedback loop is connected between said sensing resistor and said load.

8. The converter of claim 1, wherein said intermediate point in said second feedback loop is connected to the non-inverting input of said differential amplifier.

9. The converter of claim 10, further including a ramp signal generator for selectively applying to the input port of one of the second branches of one of said first and second feedback loops a ramp signal for gradually reducing said output current signal.

10. The circuit of claim 9, further including a laser source connected to the converter as the load.

11. The circuit of claim 10, further including a current drive circuit for said laser source, said drive circuit being connected between the output of said differential amplifier and said sensing resistor and in series with the laser source.

12. A circuit comprising an output terminal for connection to a load; an amplifier arrangement having an output terminal and inverting and non-inverting input terminals, the amplifier arrangement being arranged for deriving at the output terminal thereof an output voltage having a magnitude directly proportional to the difference in the voltages at the inverting and non-inverting input terminals; first and second voltage dividers; a sensing resistor connected between the circuit output terminal and the amplifier arrangement output terminal; a first feedback path connected between the output terminal of the amplifier arrangement and a first of the input terminals of the amplifier arrangement; a second feedback path connected between the output terminal of the circuit and a second of the input terminals of the amplifier arrangement, the first feedback circuit being included in a first resistive voltage divider connected between the circuit input terminal and the output terminal of the amplifier arrangement, the second feedback circuit being included in a second resistive voltage divider connected between a further terminal and the circuit output terminal, the first voltage divider having a first tap connected to drive the first input terminal of the amplifier arrangement, the second voltage divider having a second tap connected to drive the second input terminal of the amplifier arrangement; the voltage dividers having voltage division factors and the sensing resistor having a value for causing the current flowing through the circuit output terminal into the load to be directly proportional to the difference in the voltages at the circuit input terminal and the further terminal; the resistance of the first voltage divider between the output and first input terminals of the amplifier arrangement and the resistance of the second voltage divider between the circuit output terminal and the second input terminal of the amplifier arrangement being on the same order of magnitude and much greater than the resistance of the sensor resistance.

13. The circuit of claim 12, wherein the further terminal is at ground potential.

14. The circuit of claim 12, wherein the further terminal is connected to be responsive to a voltage source having a voltage other than ground.

15. The circuit of claim 12, further including a bias source, the load including a laser diode connected between the circuit output terminal and the bias source, the bias source, laser diode, circuit output terminal, sensing resistor and amplifier arrangement being arranged for causing current to flow from the bias source through the laser diode, circuit output terminal and sensing resistor into the output terminal of the amplifier arrangement.

16. A circuit comprising an output terminal for connection to a load; an amplifier arrangement having an output terminal and inverting and non-inverting input terminals, the amplifier arrangement being arranged for deriving at the output terminal thereof an output voltage having a magnitude directly proportional to the difference in the voltages at the inverting and non-inverting intput terminals; first and second voltage dividers; a sensing resistor connected between the circuit output terminal and the amplifier arrangement output terminal; a first feedback path connected between the output terminal of the amplifier arrangement and a first of the input terminals of the amplifier arrangement; a second feedback path connected between the output terminal of the circuit and a second of the input terminals of the amplifier arrangement, the first feedback circuit being included in a first resistive voltage divider connected between the circuit input terminal and the output terminal of the amplifier arrangement; the second feedback circuit being included in a second resistive voltage divider connected between a further terminal and the circuit output terminal; the first voltage divider having a first tap connected to drive the first input terminal of the amplifier arrangement, the second voltage divider having a second tap connected to drive the second input terminal of the amplifier arrangement, the voltage dividers having voltage division factors and the sensing resistor having a value for causing the current flowing through the circuit output terminal into the load to be directly proportional to the difference in the voltages at the circuit input terminal and the further terminal, the first and second input terminals being respectively the non-inverting and inverting input terminals of the amplifier arrangement.

17. The circuit of claim 16 wherein the further terminal is connected to ground and the circuit input terminal is connected to a non-zero voltage source.

18. The circuit of claim 16, wherein the further and input terminals are respectively connected to first and second non-zero voltage sources.

19. The circuit of claim 16, wherein the amplifier arrangement is arranged so the gain factor polarity between inverting and non-inverting input terminals and the output terminals of the amplifier arrangement causes the output current of the circuit to be directly proportional to and have the same polarity as ($V_A-V_B$), where $V_A$ and $V_B$ are respectively the voltages at the non-inverting and inverting input terminals.

20. The circuit of claim 16, wherein the load includes a laser diode having first and second electrodes respectively connected to be responsive to the voltages of a non-grounded terminal of a DC voltage source and the circuit output terminal, the DC voltage source polarity and the laser diode polarity being such that DC current is adapted to flow between the DC voltage source ungrounded terminal and the circuit output terminal via the laser diode.

21. The circuit of claim 20, wherein the amplifier arrangement is arranged so the gain factor polarity between inverting and non-inverting input terminals and the output terminals of the amplifier arrangement causes the output current of the circuit to be directly proportional to and have the same polarity as ($V_A-V_B$), where $V_A$ and $V_B$ are respectively the voltages at the non-inverting and inverting input terminals.

22. A circuit comprising an output terminal connected to a laser diode load; an amplifier arrangement having an output terminal and inverting and non-inverting input terminals, the amplifier arrangement being arranged for deriving at the output terminal thereof an output voltage having a magnitude directly proportional to the difference in the voltages at the inverting and non-inverting output terminals; first and second voltage dividers; a sensing resistor connected between the circuit output terminal and the amplifier arrangement output terminal; a first feedback path connected between the output terminal of the amplifier arrangement and a first of the input terminals of the amplifier arrangement; a second feedback path connected between the output terminal of the circuit and a second of the input terminals of the amplifier arrangement, the first feedback circuit being included in a first resistive voltage divider connected between the circuit input terminal and the output terminal of the amplifier arrangement, the second feedback circuit being included in a second resistive voltage divider connected between a further terminal and the circuit output terminal; the first voltage divider having a first tap connected to drive the first input terminal of the amplifier arrangement, the second voltage divider having a second tap connected to drive the second input terminal of the amplifier arrangement, the voltage dividers having voltage division factors and the sensing resistor having a value for causing the current flowing through the circuit output terminal into the laser diode load to be directly proportional to the difference in the voltages at the circuit input terminal and the further terminal, the laser diode load having first and second electrodes respectively connected to be responsive to the voltage of a non-grounded terminal of a DC voltage source and the circuit output terminal, the DC voltage source polarity and the laser diode polarity being such that DC current is adapted to flow between the DC voltage source ungrounded terminal and the circuit output terminal via the laser diode.

23. The circuit of claim 22, wherein the further terminal is connected to ground and the circuit input terminal is connected to a non-zero voltage source.

24. The circuit of claim 22, wherein the further and input terminals are respectively connected to first and second non-zero voltage sources.

25. The circuit of claim 22 wherein the amplifier arrangement is arranged so the gain factor polarity between the inverting and non-inverting input terminals and the output terminals of the amplifier arrangement causes the output current of the amplifier arrangement to be directly proportional to and have the same polarity as ($V_A-V_B$), where $V_A$ and $V_B$ are respectively the voltages at the non-inverting and inverting input terminals.

26. The circuit of claim 22, wherein the first and second input terminals of the amplifier arrangement are respectively the inverting and non-inverting input terminals.

27. A circuit comprising an output terminal for connection to a load; an amplifier arrangement having an output terminal and inverting and non-inverting input terminals, the amplifier arrangement being arranged for deriving at the output terminal thereof an output voltage having a magnitude directly proportional to the difference in the voltages at the inverting and non-inverting intput terminals; first and second voltage dividers; a sensing resistor connected between the circuit output terminal and the amplifier arrangement output terminal; a first feedback path connected between the output terminal of the amplifier arrangement and a first of the input terminals of the amplifier arrangement; a second feedback path connected between the output terminal of the circuit and a second of the input of the amplifier arrangement, the first feedback circuit being included in a first resistive voltage divider connected between the circuit input terminal and the output terminal of the amplifier arrangement, the second feedback circuit being included in a second resistive voltage divider connected between a further terminal and the circuit output terminal, the first voltage divider having a first tap connected to drive the first input terminal of the amplifier arrangement; the second voltage divider having a second tap connected to drive the second input terminal of the amplifier arrangement, the voltage dividers having voltage division factors and the sensing resistor having a value for causing the current flowing through the circuit output terminal into the load to be directly proportional to the difference in the voltages at the circuit input terminal and the further terminal; the resistance ($R_1$) of the first voltage divider between the output terminal and first input terminal of the amplifier arrangement matched magnitude to the resistance of the second voltage divider between the circuit output terminal and the second terminal of the amplifier arrangement, the resistance ($R_2$) of the first voltage divider between the first input terminal of the amplifier arrangement and the circuit input terminal being of the same order of magnitude as the resistance between the second input terminal of the amplifier arrangement and the further terminal.

28. The circuit of claim 27, wherein $R_1$ is much greater than the resistance of the sensing resistor.

29. The circuit of claim 27, wherein the further terminal is connected to ground and the circuit input terminal is connected to a non-zero voltage source.

30. The circuit of claim 27, wherein the further and the input terminals are respectively connected to the first and second voltage sources having values that are not zero.

31. The circuit of claim 27, wherein the amplifier arrangement is arranged so the gain factor polarity between inverting and non-inverting input terminals and the output terminals of the amplifier arrangement causes the output current of the amplifier arrangement to be directly proportional to and have the same polarity as ($V_A-V_B$), where $V_A$ and $V_B$ are respectively the voltages at the non-inverting and inverting input terminals.

32. The circuit of claim 27, wherein the load includes a laser diode having first and second electrodes respectively connected to be responsive to the voltage of a non-grounded terminal of a DC voltage source and the circuit output terminal, the DC voltage source polarity and the laser diode polarity being such that DC current is adapted to flow between the DC voltage source ungrounded terminal and the circuit output terminal via the laser diode.

33. The circuit of claim 32, wherein the amplifier arrangement is arranged so the gain factor polarity between inverting and non-inverting input terminals and the output terminals of the amplifier arrangement causes the output current of the amplifier arrangement to be directly proportional to and have the same polarity as ($V_A-V_B$), where $V_A$ and $V_B$ are respectively the voltages at the non-inverting and inverting input terminals.

34. The circuit of claim 32, wherein the first and second input terminals of the amplifier arrangement are respectively the inverting and non-inverting input terminals.

* * * * *